United States Patent
Wang et al.

(10) Patent No.: US 12,293,274 B2
(45) Date of Patent: May 6, 2025

(54) METHOD AND APPARATUS FOR UNIFICATION BASED CODING FOR NEURAL NETWORK MODEL COMPRESSION

(71) Applicant: TENCENT AMERICA LLC, Palo Alto, CA (US)

(72) Inventors: Wei Wang, Palo Alto, CA (US); Wei Jiang, Palo Alto, CA (US); Shan Liu, Palo Alto, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 927 days.

(21) Appl. No.: 17/365,367

(22) Filed: Jul. 1, 2021

(65) Prior Publication Data

US 2022/0114414 A1    Apr. 14, 2022

Related U.S. Application Data

(60) Provisional application No. 63/089,443, filed on Oct. 8, 2020.

(51) Int. Cl.
*H03M 7/00* (2006.01)
*G06F 17/00* (2019.01)
(Continued)

(52) U.S. Cl.
CPC ............... *G06N 3/04* (2013.01); *H03M 7/30* (2013.01); *H03M 7/6011* (2013.01)

(58) Field of Classification Search
CPC .... H03M 7/70; H03M 7/3059; H03M 7/3064; H03M 7/3079; H03M 7/3082; H03M 7/4075; H03M 7/6005; G06N 3/045; G06N 3/02; G06N 3/0455; G06N 3/048; G06N 3/049; G06N 3/0495; G06N 3/08;
(Continued)

(56) References Cited

U.S. PATENT DOCUMENTS 4,972,187 A * 11/1990 Wecker .................... G06N 3/04
                                                                      341/83
5,268,684 A * 12/1993 Allen ....................... G06N 3/04
                                                                      341/75
(Continued)

OTHER PUBLICATIONS

Extended European Search Report dated Nov. 22, 2022 in European Application No. 21878168.0.
(Continued)

*Primary Examiner* — Linh V Nguyen
(74) *Attorney, Agent, or Firm* — Sughrue Mion, PLLC

(57) ABSTRACT

A method of unification based coding for neural network model compression is performed by at least one processor and includes receiving a layer uniform flag indicating whether a quantized weight of an input neural network is encoded using a uniform coding method, and determining whether the quantized weight is encoded using the uniform coding method, based on the received layer uniform flag. The method further includes, based on the quantized weight being determined to be encoded using the uniform coding method, encoding the quantized weight, using the uniform coding method, and based on the quantized weight being determined to not be encoded using the uniform coding method, encoding the quantized weight, using a non-uniform coding method.

20 Claims, 8 Drawing Sheets

(51) Int. Cl.
 *G06N 3/04* (2023.01)
 *H03M 7/30* (2006.01)
(58) Field of Classification Search
 CPC ........ G06N 3/084; G06N 3/088; G06N 3/105;
   G06F 2207/4824; G06F 7/48; G06F
   7/523; H04N 19/119; H04N 19/124;
   H04N 19/129; H04N 19/13; H04N
   19/147; H04N 19/176; H04N 19/46;
   H04N 19/70; H04N 19/94; H04N 19/96
 USPC .......... 341/50, 51, 78, 106, 107; 364/514 R,
   364/715.02
 See application file for complete search history.

(56) References Cited

U.S. PATENT DOCUMENTS

| | | | | |
|---|---|---|---|---|
| 5,598,354 | A * | 1/1997 | Fang | G06T 9/002 708/203 |
| 7,054,850 | B2 * | 5/2006 | Matsugu | G06V 10/454 706/31 |
| 10,140,573 | B2 * | 11/2018 | Julian | G06N 3/048 |
| 10,713,561 | B2 * | 7/2020 | Alvarez-Icaza Rivera | G06N 3/049 |
| 11,106,973 | B2 * | 8/2021 | Shi | G06N 3/063 |
| 11,455,539 | B2 * | 9/2022 | Lee | G06N 3/048 |
| 2008/0015850 | A1 | 1/2008 | Chen et al. | |
| 2011/0090950 | A1 * | 4/2011 | Bush | H04N 19/12 375/240 |
| 2012/0027077 | A1 * | 2/2012 | Reznik | H04N 19/91 375/240.2 |
| 2014/0046885 | A1 * | 2/2014 | Majumdar | G06N 3/049 706/22 |
| 2017/0286830 | A1 | 10/2017 | El-Yaniv et al. | |

OTHER PUBLICATIONS

"Description of Core Experiments on Compression of neural networks for multimedia content description and analysis", ISO/IEC JTC 1/SC 29/WG 11 N 18991, 2020, Coding of moving pictures and audio Convenorship: UNI (Italy), January, Brussels, BE (22 pages total).

Wei Wang et al., "NNR CE3: adaptive 3D partition and 3D-Tree based coding method", International Organisation for Standardisation Organisation Internationale de Normalisation, 2020, ISO/IEC JTC1/SC29/WG11 MPEG2020/M53772, Virtual Meeting (13 pages total).

"Information technology—Multimedia content description interface—Part 17: Compression of neural networks for multimedia content description and analysis", 2020, ISO 15938-17, (73 pages total).

International Search Report dated Dec. 17, 2021 in International Application No. PCT/US2021/044905.

Written Opinion of the International Searching Authority dated Dec. 17, 2021 in International Application No. PCT/US2021/044905.

Wei Jiang et al., "Structured Weight Unification and Encoding for Neural Network Compression and Acceleration", Proceedings of the IEEE/CVF Conference on Computer Vision and Pattern Recognition Workshops, 2020, Retrieved from: URL: <https://ieeexplore.ieee.org/abstract/document/9150942> (12 pages total).

Yi-Min Chou et al., "Unifying and Merging Well-trained Deep Neural Networks for Inference Stage", 2018, Retrieved from: URL: <https://arxiv.org/pdf/1805.04980.pdf> (8 pages total).

Tencent America LLC, "NNR CE4 Method 15: Simplified coding method for unified model", International Organisation for Standardisation Organisation Internationale De Normalisation ISO/IEC JTC1/SC29/WG11 Coding of Moving Pictures and Audio, ISO/IEC JTC1/SC29/WG11 MPEG2020/M55023, Oct. 2020, pp. 1-5.

Communication issued Dec. 21, 2024 in Chinese Application No. 202180006255.7.

* cited by examiner

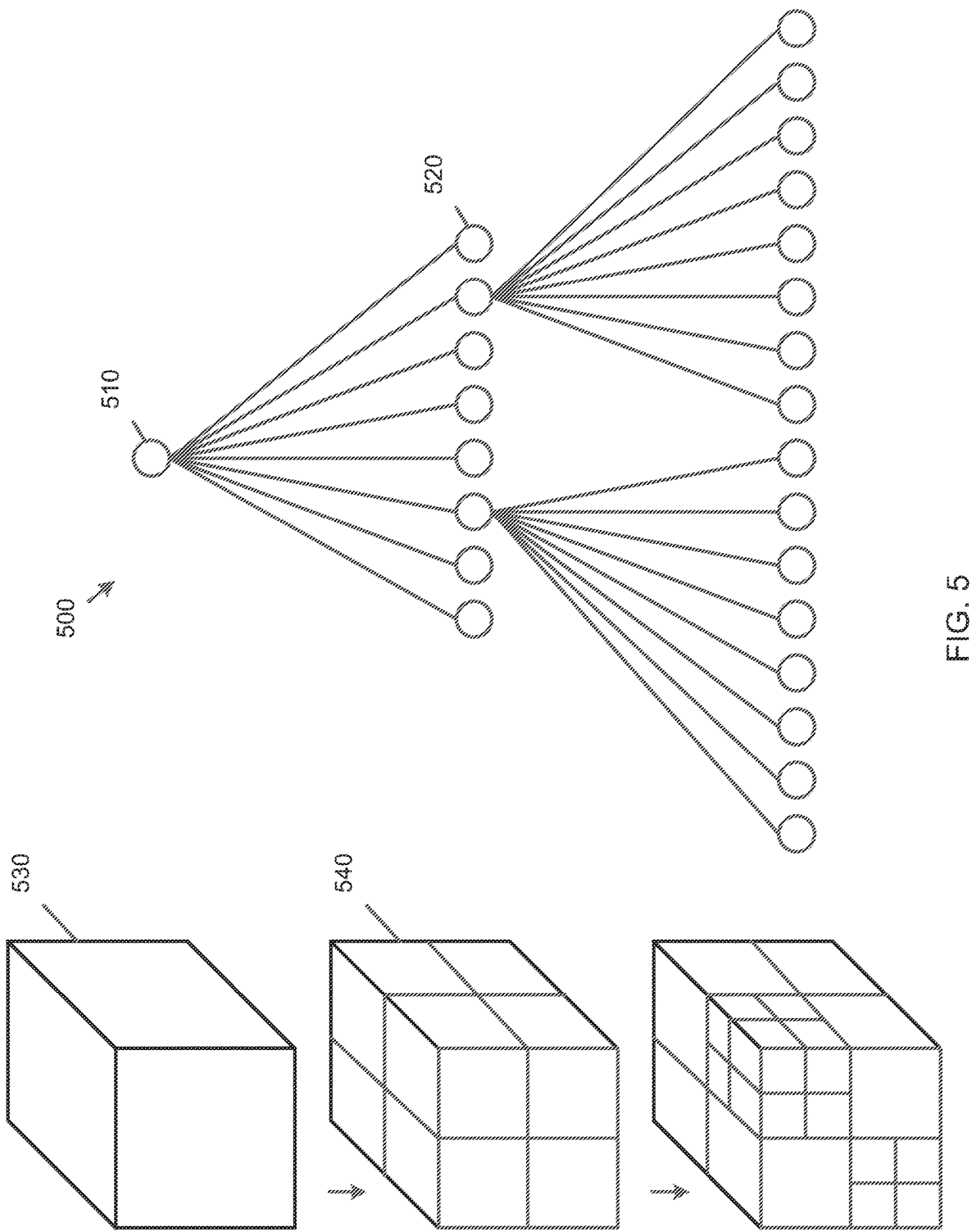

METHOD AND APPARATUS FOR UNIFICATION BASED CODING FOR NEURAL NETWORK MODEL COMPRESSION

CROSS-REFERENCE TO RELATED APPLICATION

This application is based on and claims priority to U.S. Provisional Patent Application No. 63/089,443, filed on Oct. 8, 2020, in the U.S. Patent and Trademark Office, the disclosures of which are incorporated herein by reference in their entireties.

BACKGROUND

Success of Deep Neural Networks (DNNs) in a large range of video applications such as semantic classification, target detection/recognition, target tracking, video quality enhancement, etc. may pose a need for compressing DNN models. Therefore, the Motion Picture Experts Group (MPEG) is actively working on the Coded Representation of Neural Network standard (NNR) that is used to encode DNN models to save both storage and computation.

SUMMARY

According to embodiments, a method of unification based coding for neural network model compression is performed by at least one processor and includes receiving a layer uniform flag indicating whether a quantized weight of an input neural network is encoded using a uniform coding method, determining whether the quantized weight is encoded using the uniform coding method, based on the received layer uniform flag, based on the quantized weight being determined to be encoded using the uniform coding method, encoding the quantized weight, using the uniform coding method, and based on the quantized weight being determined to not be encoded using the uniform coding method, encoding the quantized weight, using a non-uniform coding method.

According to embodiments, an apparatus for unification based coding for neural network model compression includes at least one memory configured to store program code, and at least one processor configured to read the program code and operate as instructed by the program code. The program code includes receiving code configured to cause the at least one processor to receive a layer uniform flag indicating whether a quantized weight of an input neural network is encoded using a uniform coding method, and determining code configured to cause the at least one processor to determine whether the quantized weight is encoded using the uniform coding method, based on the received layer uniform flag. The program code further includes first encoding code configured to cause the at least one processor to, based on the quantized weight being determined to be encoded using the uniform coding method, encode the quantized weight, using the uniform coding method, and second encoding code configured to cause the at least one processor to, based on the quantized weight being determined to not be encoded using the uniform coding method, encode the quantized weight, using a non-uniform coding method.

According to embodiments, a non-transitory computer-readable storage medium stores instructions that, when executed by at least one processor for unification based coding for neural network model compression, cause the at least one processor to receive a layer uniform flag indicating whether a quantized weight of an input neural network is encoded using a uniform coding method, determine whether the quantized weight is encoded using the uniform coding method, based on the received layer uniform flag, based on the quantized weight being determined to be encoded using the uniform coding method, encode the quantized weight, using the uniform coding method, and based on the quantized weight being determined to not be encoded using the uniform coding method, encode the quantized weight, using a non-uniform coding method.

BRIEF DESCRIPTION OF THE DRAWINGS

FIG. 5 is a diagram of an example of a 3D-Octree structure with three depths, according to embodiments.

DETAILED DESCRIPTION

Figure 1:
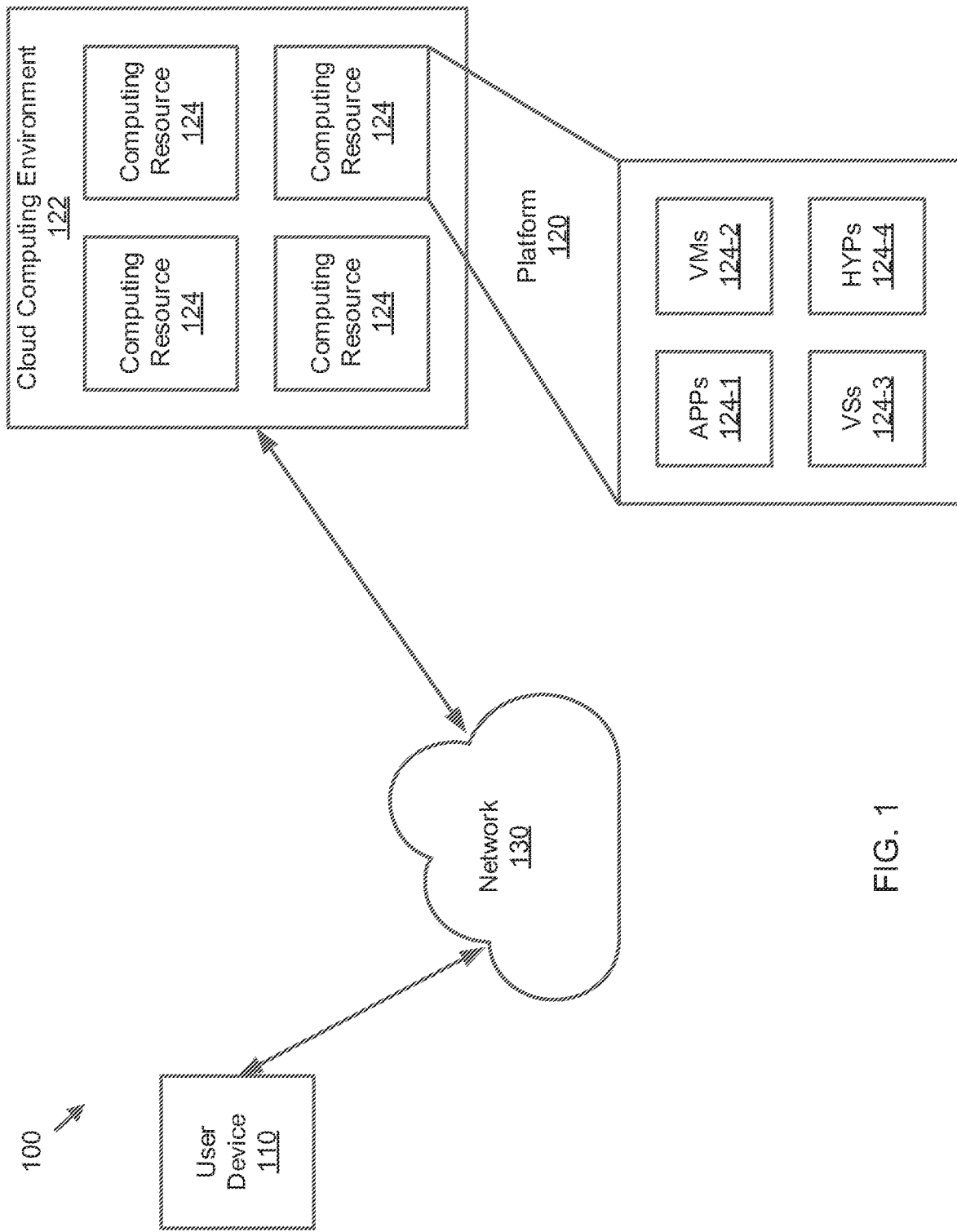
FIG. 1 is a diagram of an environment in which methods, apparatuses and systems described herein may be implemented, according to embodiments.

This disclosure is related to neural network model compression. To be more specific, methods and apparatuses described herein are related to a harmonization between baseline and unification coding for neural network model compression.

Scan Order

In neural network compression for multimedia content description and analysis, an encoding method scans a parameter tensor in a row-first manner from left to right and scans rows from the top to the bottom.

TABLE 1

```
quant_tensor( dimensions, maxNumNoRem) {
  stateId = 0
  for( i = 0; i < Prod( dimensions ); i++ ) {
    idx = TensorIndex( dimensions, i )
    int_param( idx, maxNumNoRem, stateId )
    if(dq_flag) {
      nextSt= StateTransTab[stateId][QuantParam[idx] & 1]
      if( QuantParam[idx] != 0 ) {
        QuantParam[idx] = QuantParam[idx] << 1
        QuantParam[idx] += QuantParam[idx] < 0 ? ( stateId & 1 ) : -( stateId & 1 )
      }
      stateId = nextSt
    }
  }
}
```

A two-dimensional (2D) integer array StateTransTab[ ][ ] specifies a state transition table for dependent scalar quantization, as follows:

$$\text{StateTransTab[ ][ ]}=\{\{0,2\},\{7,5\},\{1,3\},\{6,4\},\{2,0\},\{5,7\},\{3,1\},\{4,6\}\}. \quad (1)$$

Quantization

In neural network compression for multimedia content description and analysis, three type of quantization methods are used:

Baseline method: uniform quantisation is applied to parameter tensors using a fixed step size represented by parameters qpDensity and qp and a flag dq_flag equal to zero. Reconstructed values in a decoded tensor are integer multiples of the step size.

Codebook-based method: parameter tensors are represented as a codebook and tensors of indices, the latter having the same shape as original tensors. A size of the codebook is chosen at an encoder and is transmitted as a metadata parameter. The indices have integer values, and will be further entropy coded. The codebook is composed of float32 values. The reconstructed values in the decoded tensors are values of codebook elements referred to by their index values.

Dependent scalar quantization method: dependent scalar quantization is applied to parameter tensors using a fixed step size represented by parameters qpDensity and qp and a state transition table of size 8, whenever a flag dq_flag is equal to one. Reconstructed values in a decoded tensor are integer multiples of the step size.

Entropy Coding

In neural network compression for multimedia content description and analysis, an encoding method scans a parameter tensor in a row-first manner from left to right and scans rows from top to bottom. Each quantized parameter level is encoded according to the following procedure employing an integer parameter maxNumNoRem:

In a first step, a binary syntax element sig_flag is encoded for a quantized parameter level, which specifies whether a corresponding level is equal to zero. If the sig_flag is equal to one, a further binary syntax element sign_flag is encoded. The bin indicates if a current parameter level is positive or negative. Next, a unary sequence of bins is encoded, followed by a fixed length sequence as follows.

A variable k is initialized with zero and X is initialized with 1<<k. A syntax elements abs_level_greater_X is encoded, which indicates that an absolute value of a quantized parameter level is greater than X. If abs_level_greater_X is equal to 1 and if X is greater than maxNumNoRem, a variable k is increased by 1. Afterwards, 1<<k is added to X and a further abs_level_greater_X is encoded. This procedure is continued until an abs_level_greater_X is equal to 0. Now, it is clear that X may be one of the values (X, X−1, . . . , X−(1<<k)+1). A code of length k is encoded, which points to values in a list that is an absolute quantized parameter level.

Context modeling corresponds to associating three type of flags sig_flag, sign_flag, and abs_level_greater_X with context models. In this way, flags with similar statistical behavior may be associated with the same context model so that a probability estimator (inside of a context model) can adapt to underlying statistics.

A context modeling of a presented approach is as follows.

Twenty-four context models are distinguished for a sig_flag, depending on a state value and whether a neighboring quantized parameter level to the left is zero, smaller, or larger than zero.

Three other context models are distinguished for the sign_flag depending on whether the neighboring quantized parameter level to the left is zero, smaller, or larger than zero.

For abs_level_greater_X flags, each X uses either one or two separate context models. If X<=maxNumNoRem, two context models are distinguished depending on the sign_flag. If X>maxNumNoRem, only one context model is used.

TABLE 2

```
int_param( i, maxNumNoRem, stateId ) {
  QuantParam[i] = 0
  sig_flag
  if( sig_flag ) {
    QuantParam[i]++
    sign_flag
    j = −1
    do {
      j++
      abs_level_greater_x[j]
      QuantParam[i] += abs_level_greater_x[j]
    } while( abs_level_greater_x[j] == 1 &&j < maxNumNoRem )
    if( j == maxNumNoRem ) {
      RemBits = 0
      j = −1
      do {
        j++
        abs_level_greater_x2[j]
        if( abs_level_greater_x2[j] ) {
          RemBits++
          QuantParam[i] += 1 << RemBits
        }
      } while( abs_level_greater_x2[j] )
      abs_remainder
      QuantParam[i] += abs_remainder
    }
    QuantParam[i] = sign_flag ? −QuantParam[i] : QuantParam[i]
  }
}
```

| | |
|---|---|
| sig_flag | specifies whether the quantized weight QuantParam[i] is nonzero. A sig_flag equal to 0 indicates that QuantParam[i] is zero. |
| sign_flag | specifies whether the quantized weight QuantParam[i] is positive or negative. A sign_flag equal to 1 indicates that QuantParam[i] is negative. |
| abs_level_greater_x[j] | indicates whether the absolute level of QuantParam[i] is greater j + 1. |
| abs_level_greater_x2[j] | includes the unary part of the exponential golomb remainder. |
| abs_remainder | indicates a fixed length remainder. |

Entropy coding is performed on a quantized weight coefficient directly. It does not consider a local distribution after a weight tensor is partitioned to non-overlapping CTU3D blocks. Most weight coefficients have a local structure after a retrain operation. A method utilizing 3D-Octree, 3D-Unitree, 3D-Tagtree and/or 3D-Unitagtree structure can generate more efficient representation by making use of the local distribution of the CTU3D blocks. These methods have not been harmonized with the aforementioned baseline method yet.

FIG. 1 is a diagram of an environment 100 in which methods, apparatuses and systems described herein may be implemented, according to embodiments.

As shown in FIG. 1, the environment 100 may include a user device 110, a platform 120, and a network 130. Devices of the environment 100 may interconnect via wired connections, wireless connections, or a combination of wired and wireless connections.

The user device 110 includes one or more devices capable of receiving, generating, storing, processing, and/or providing information associated with platform 120. For example, the user device 110 may include a computing device (e.g., a desktop computer, a laptop computer, a tablet computer, a handheld computer, a smart speaker, a server, etc.), a mobile phone (e.g., a smart phone, a radiotelephone, etc.), a wearable device (e.g., a pair of smart glasses or a smart watch), or a similar device. In some implementations, the user device 110 may receive information from and/or transmit information to the platform 120.

The platform 120 includes one or more devices as described elsewhere herein. In some implementations, the platform 120 may include a cloud server or a group of cloud servers. In some implementations, the platform 120 may be designed to be modular such that software components may be swapped in or out. As such, the platform 120 may be easily and/or quickly reconfigured for different uses.

In some implementations, as shown, the platform 120 may be hosted in a cloud computing environment 122. Notably, while implementations described herein describe the platform 120 as being hosted in the cloud computing environment 122, in some implementations, the platform 120 may not be cloud-based (i.e., may be implemented outside of a cloud computing environment) or may be partially cloud-based.

The cloud computing environment 122 includes an environment that hosts the platform 120. The cloud computing environment 122 may provide computation, software, data access, storage, etc. services that do not require end-user (e.g., the user device 110) knowledge of a physical location and configuration of system(s) and/or device(s) that hosts the platform 120. As shown, the cloud computing environment 122 may include a group of computing resources 124 (referred to collectively as "computing resources 124" and individually as "computing resource 124").

The computing resource 124 includes one or more personal computers, workstation computers, server devices, or other types of computation and/or communication devices. In some implementations, the computing resource 124 may host the platform 120. The cloud resources may include compute instances executing in the computing resource 124, storage devices provided in the computing resource 124, data transfer devices provided by the computing resource 124, etc. In some implementations, the computing resource 124 may communicate with other computing resources 124 via wired connections, wireless connections, or a combination of wired and wireless connections.

As further shown in FIG. 1, the computing resource 124 includes a group of cloud resources, such as one or more applications ("APPs") 124-1, one or more virtual machines ("VMs") 124-2, virtualized storage ("VSs") 124-3, one or more hypervisors ("HYPs") 124-4, or the like.

The application 124-1 includes one or more software applications that may be provided to or accessed by the user device 110 and/or the platform 120. The application 124-1 may eliminate a need to install and execute the software applications on the user device 110. For example, the application 124-1 may include software associated with the platform 120 and/or any other software capable of being provided via the cloud computing environment 122. In some implementations, one application 124-1 may send/receive information to/from one or more other applications 124-1, via the virtual machine 124-2.

The virtual machine 124-2 includes a software implementation of a machine (e.g., a computer) that executes programs like a physical machine. The virtual machine 124-2 may be either a system virtual machine or a process virtual machine, depending upon use and degree of correspondence to any real machine by the virtual machine 124-2. A system virtual machine may provide a complete system platform that supports execution of a complete operating system ("OS"). A process virtual machine may execute a single program, and may support a single process. In some implementations, the virtual machine 124-2 may execute on behalf of a user (e.g., the user device 110), and may manage infrastructure of the cloud computing environment 122, such as data management, synchronization, or long-duration data transfers.

The virtualized storage 124-3 includes one or more storage systems and/or one or more devices that use virtualization techniques within the storage systems or devices of the computing resource 124. In some implementations, within the context of a storage system, types of virtualizations may include block virtualization and file virtualization. Block virtualization may refer to abstraction (or separation) of logical storage from physical storage so that the storage system may be accessed without regard to physical storage or heterogeneous structure. The separation may permit administrators of the storage system flexibility in how the administrators manage storage for end users. File virtualization may eliminate dependencies between data accessed at a file level and a location where files are physically stored. This may enable optimization of storage use, server consolidation, and/or performance of non-disruptive file migrations.

The hypervisor 124-4 may provide hardware virtualization techniques that allow multiple operating systems (e.g., "guest operating systems") to execute concurrently on a host computer, such as the computing resource 124. The hypervisor 124-4 may present a virtual operating platform to the guest operating systems, and may manage the execution of the guest operating systems. Multiple instances of a variety of operating systems may share virtualized hardware resources.

The network 130 includes one or more wired and/or wireless networks. For example, the network 130 may include a cellular network (e.g., a fifth generation (5G) network, a long-term evolution (LTE) network, a third generation (3G) network, a code division multiple access (CDMA) network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, or the like, and/or a combination of these or other types of networks.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the environment 100 may perform one or more functions described as being performed by another set of devices of the environment 100.

Figure 2:
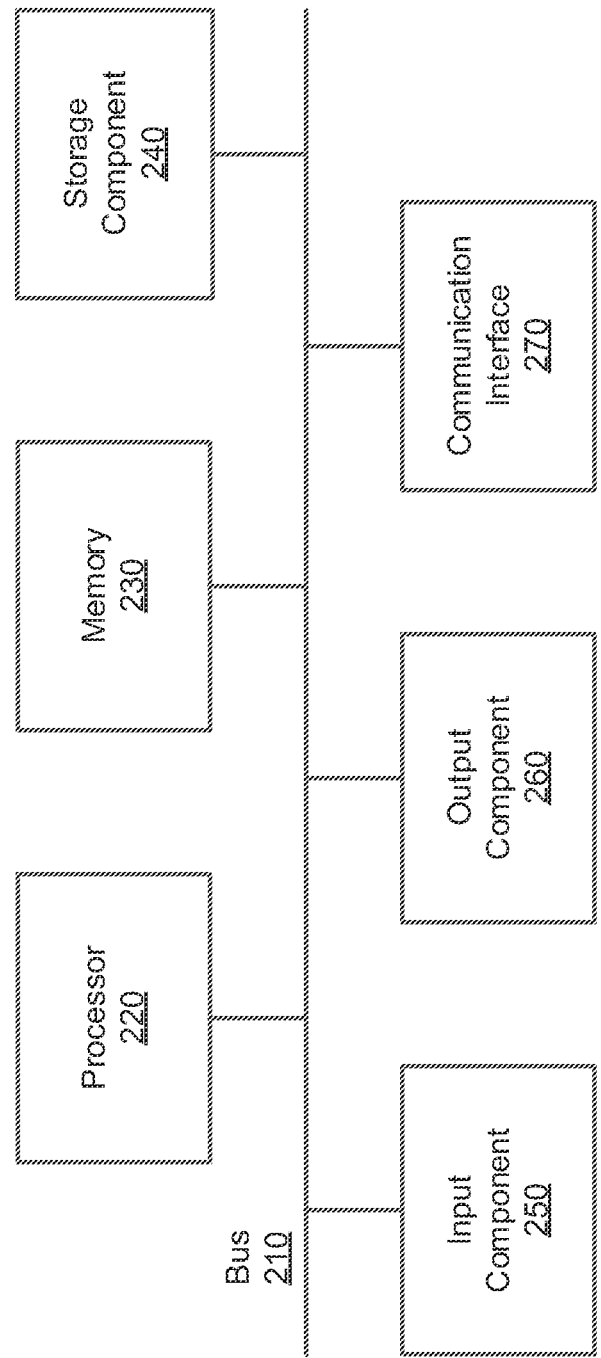
FIG. 2 is a block diagram of example components of one or more devices of FIG. 1.

FIG. 2 is a block diagram of example components of one or more devices of FIG. 1.

A device 200 may correspond to the user device 110 and/or the platform 120. As shown in FIG. 2, the device 200 may include a bus 210, a processor 220, a memory 230, a storage component 240, an input component 250, an output component 260, and a communication interface 270.

The bus 210 includes a component that permits communication among the components of the device 200. The processor 220 is implemented in hardware, firmware, or a combination of hardware and software. The processor 220 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, the processor 220 includes one or more processors capable of being programmed to perform a function. The memory 230 includes a random access memory (RAM), a read only memory (ROM), and/or another type of dynamic or static storage device (e.g., a flash memory, a magnetic memory, and/or an optical memory) that stores information and/or instructions for use by the processor 220.

The storage component 240 stores information and/or software related to the operation and use of the device 200. For example, the storage component 240 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

The input component 250 includes a component that permits the device 200 to receive information, such as via user input (e.g., a touch screen display, a keyboard, a keypad, a mouse, a button, a switch, and/or a microphone). Additionally, or alternatively, the input component 250 may include a sensor for sensing information (e.g., a global positioning system (GPS) component, an accelerometer, a gyroscope, and/or an actuator). The output component 260 includes a component that provides output information from the device 200 (e.g., a display, a speaker, and/or one or more light-emitting diodes (LEDs)).

The communication interface 270 includes a transceiver-like component (e.g., a transceiver and/or a separate receiver and transmitter) that enables the device 200 to communicate with other devices, such as via a wired connection, a wireless connection, or a combination of wired and wireless connections. The communication interface 270 may permit the device 200 to receive information from another device and/or provide information to another device. For example, the communication interface 270 may include an Ethernet interface, an optical interface, a coaxial interface, an infrared interface, a radio frequency (RF) interface, a universal serial bus (USB) interface, a Wi-Fi interface, a cellular network interface, or the like.

The device 200 may perform one or more processes described herein. The device 200 may perform these processes in response to the processor 220 executing software instructions stored by a non-transitory computer-readable medium, such as the memory 230 and/or the storage component 240. A computer-readable medium is defined herein as a non-transitory memory device. A memory device includes memory space within a single physical storage device or memory space spread across multiple physical storage devices.

Software instructions may be read into the memory 230 and/or the storage component 240 from another computer-readable medium or from another device via the communication interface 270. When executed, software instructions stored in the memory 230 and/or the storage component 240 may cause the processor 220 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 2 are provided as an example. In practice, the device 200 may include additional components, fewer components, different components, or differently arranged components than those shown in FIG. 2. Additionally, or alternatively, a set of components (e.g., one or more components) of the device 200 may perform one or more functions described as being performed by another set of components of the device 200.

Figure 3:
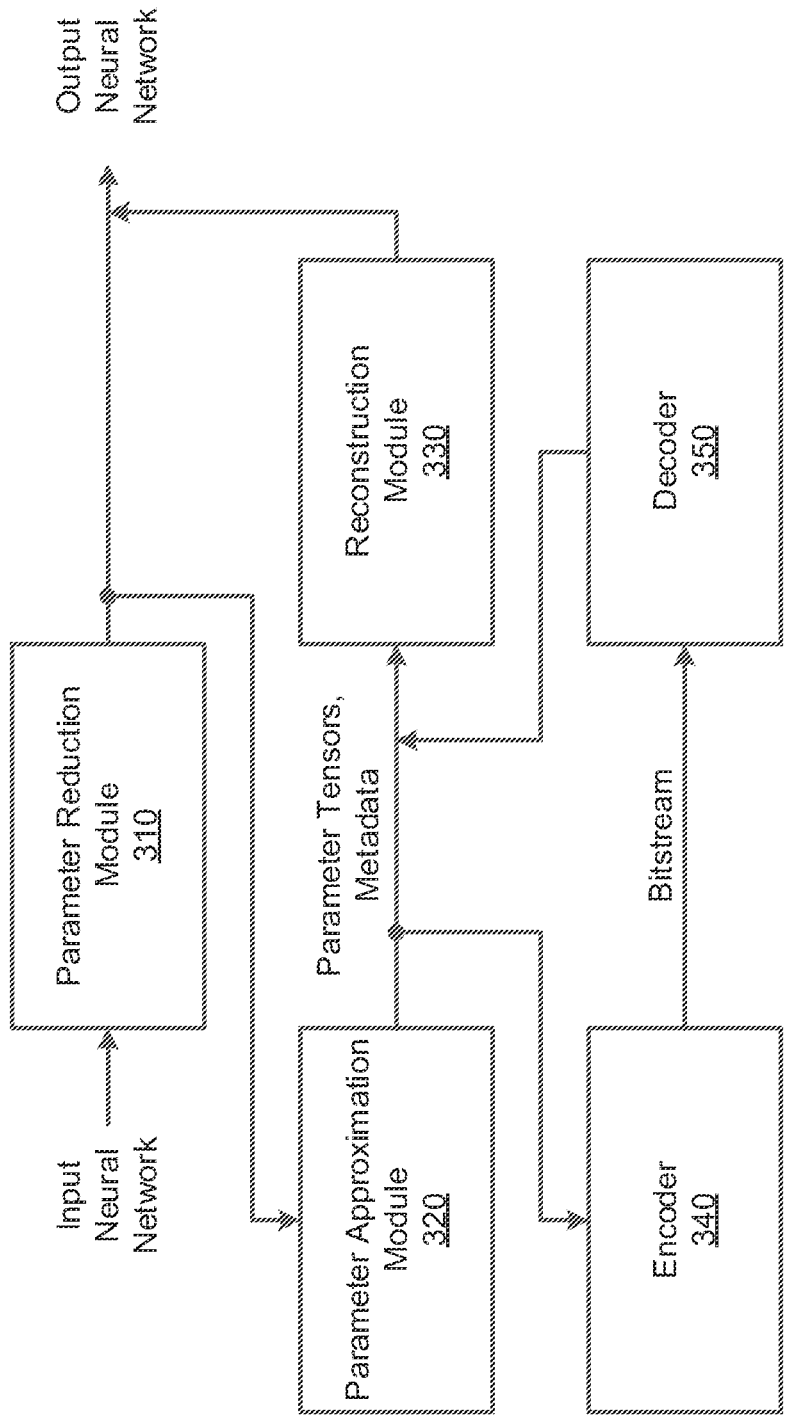
FIG. 3 is a functional block diagram of a system for neural network model compression, according to embodiments.

FIG. 3 is a functional block diagram of a system 300 for neural network model compression, according to embodiments.

As shown in FIG. 3, the system 300 includes a parameter reduction module 310, a parameter approximation module 320, a reconstruction module 330, an encoder 340, and a decoder 350.

The parameter reduction module 310 reduces a set of parameters of an input neural network, to obtain an output neural network. The neural network may include the parameters and an architecture as specified by a deep learning framework.

For example, the parameter reduction module 310 may sparsify (set weights to zero) and/or prune away connections of the neural network. In another example, the parameter reduction module 310 may perform matrix decomposition on parameter tensors of the neural network into a set of smaller parameter tensors. The parameter reduction module 310 may perform these methods in cascade, for example, may first sparsify the weights and then decompose a resulting matrix.

The parameter approximation module 320 applies parameter approximation techniques on parameter tensors that are extracted from the output neural network that is obtained from the parameter reduction module 310. For example, the techniques may include any one or any combination of quantization, transformation and prediction. The parameter approximation module 320 outputs first parameter tensors that are not modified by the parameter approximation module 320, second parameter tensors that are modified or approximated by the parameter approximation module 320, and respective metadata to be used to reconstruct original parameter tensors that are not modified by the parameter approximation module 320, from the modified second parameter tensors.

The reconstruction module 330 reconstructs the original parameter tensors from the modified second parameter tensors that are obtained from the parameter approximation module 320 and/or the decoder 350, using the respective metadata that is obtained from the parameter approximation module 320 and/or the decoder 350. The reconstruction module 330 may reconstruct the output neural network, using the reconstructed original parameter tensors and the first parameter tensors.

The encoder 340 may perform entropy encoding on the first parameter tensors, the second parameter tensors and the respective metadata that are obtained from the parameter approximation module 320. This information may be encoded into a bitstream to the decoder 350.

The decoder 350 may decode the bitstream that is obtained from the encoder 340, to obtain the first parameter tensors, the second parameter tensors and the respective metadata.

The system 300 may be implemented in the platform 120, and one or more modules of FIG. 3 may be performed by a device or a group of devices separate from or including the platform 120, such as the user device 110.

Methods and apparatuses for unification based coding for neural network model compression will now be described in detail.

CTU3D and Recursive CU3D Block Partitioning

A dimension of weight tensor is usually 4 for a convolution layer with a layout of [R][S][C][K], 2 for a fully-connected layer with a layout of [C][K], and 1 for a bias and batch normal layer, where R/S is a convolution kernel size, C is an input feature size and K is an output feature size.

For a convolution layer, a 2D [R][S] dimension is reshaped to an one-dimensional (1D) [RS] dimension so that a four-dimensional (4D) tensor [R][S][C][K] is reshaped to a 3D tensor [RS][C][K]. A fully-connected layer is treated as a case of the 3D tensor with R=S=1.

A 3D tensor [RS][C][K] along a [C][K] plane is partitioned into non-overlapping smaller blocks (CTU3D). Each CTU3D has a shape of [RS][ctu3d_height][ctu3d_width] where ctu3d_height=max_ctu3d_height and ctu3d_width=max_ctu3d_width.

Figure 4:
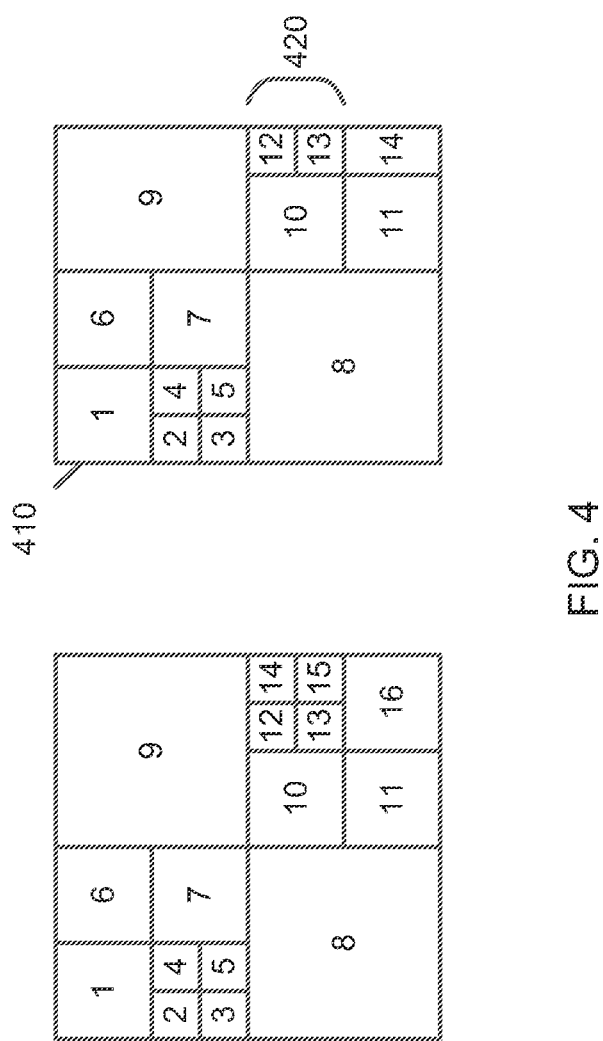
FIG. 4 is a diagram of two examples of an adaptive three-dimensional (3D) coding tree unit (CTU3D)/3D coding unit (CU3D) partition using a raster scan at a vertical direction, according to embodiments.

As shown in FIG. 4, for a CTU3D 410, at a right and/or bottom of a tensor, a parent CU3D node 420 at a given depth may not have all 4 child nodes. For the parent CU3D node 420 located at the right and/or bottom of the tensor, its ctu3d_height is a remainder of C/max_ctu3d_height, and its ctu3d_width is a remainder of K/max_ctu3d_width.

Values of max_ctu3d_height and max_ctu3d_width can be signalled to a bitstream explicitly, or can be inferred inexplicitly. Block partitioning is disabled when max_ctu3d_height=C and max_ctu3d_width=K.

A simplified blocking structure is used, in which CTU3D/CU3D is partitioned to smaller CU3Ds recursively using a quad-tree structure until a maximum recursive depth is reached. Starting from a CTU3D node, this quad-tree of CU3Ds are scanned and processed using a depth-first quad-tree scan order. Child nodes under the same parent node are scanned and processed using a raster scan order at either a horizontal direction or a vertical direction.

In embodiments, for CU3Ds at a given quad-tree depth, a max_cu3d_height/max_cu3d_width of these CU3Ds is calculated using below formulas, and a maximum recursive depth is reached when each of max_cu3d_height and max_cu3d_width is smaller than or equal to a predefined threshold. This threshold can either be included in a bitstream explicitly, or can be a predefined number (such as 8) so it can be inferred by a decoder implicitly. This recursive partitioning is disabled when the predefined threshold is a size of CTU3D.

$$\mathrm{max\_}cu3d\mathrm{\_height}=\mathrm{max\_}ctu3d\mathrm{\_height}>>\mathrm{depth}. \quad (2)$$

$$\mathrm{max\_}cu3d\mathrm{\_width}=\mathrm{max\_}ctu3d\mathrm{\_width}>>\mathrm{depth}. \quad (3)$$

A Rate-Distortion (RD) based encoding algorithm is used to decide whether to split a parent CU3D to multiple smaller child CU3Ds. The parent CU3D is split to multiple smaller child CU3Ds if a combined RD of these smaller child CU3Ds are smaller than an RD from the parent CU3D. Otherwise, this parent CU3D is not split. A split flag is defined to record a splitting decision. This flag can be skipped at a last depth of coding unit (CU) partitioning.

In embodiments, a recursive CU3D block partitioning operation is performed, and a split flag is defined to record a splitting decision.

In embodiments, a recursive CU3D block partitioning operation is not performed, and no split flag is defined to record a splitting decision. In this case, a CU3D block is identical to CTU3D block.

3D-Pyramid Structure

A 3D-Pyramid structure is a tree data structure in which each internal node has exactly eight children. A 3D-Pyramid is used to partition a three-dimensional tensor by recursively subdividing it along z, y, x axes into eight octants.

Multiple methods may be used to construct this 3D-Tree structure to represent coefficients in a CU3D.

A 3D-Octree for a CU3D is constructed as follows: a node value 1 for a 3D-Octree location at a last depth indicates that a codebook index (if a codebook coding method is used) or a coefficient (if a direct quantization coding method is used) in a corresponding CU3D is non-zero, and a node value 0 for a 3D-Octree location at a bottom depth indicates that a codebook index or a coefficient in a corresponding CU3D is zero. The node value for a 3D-Octree location at another depth is defined as a maximum value of its eight child nodes.

As shown in FIG. 5, an Octree 500 is a tree data structure in which each internal node 510 has exactly eight child nodes 520. A 3D-Octree is used to partition a three-dimensional tensor 530 by recursively subdividing it along z, y, x axes into eight octants 540.

A 3D-Unitree for a CU3D is constructed as follows: a node value 1 for a 3D-Unitree location at a depth other than a last depth indicates that its child nodes (and their child nodes, including nodes at the last depth) have non-unified (different) values, and a node value 0 for a 3D-Unitree location at a depth other than the last depth indicates that all its child nodes (and their child nodes, including nodes at the last depth) have unified (identical) absolute values.

A 3D-Tagtree for a CU3D is constructed as follows: a node value for a 3D-Tagtree location at a last depth indicates an absolute value of a codebook index (if a codebook coding method is used) or an absolute coefficient (if a direct quantization coding method is used) in a corresponding CU3D is non-zero. The node value for a 3D-Tagtree location at another depth is defined as a minimum value of its eight child nodes.

The 3D-Unitagtree for a CU3D is constructed by combining the 3D-Tagtree and the 3D-Unitree.

For some CU3Ds with different depths/heights/widths, there are not enough coefficients to construct a complete 3D-Pyramid in which each parent node has all eight child nodes available. Scanning and encoding of these non-existing child nodes are skipped if a parent node does not have all eight child nodes.

3D-Pyramid Scan Order

After a 3D-Pyramid is constructed, all nodes are walked through using a predefined scan order to encode a node value.

In embodiments, starting from a top node, a depth-first-search scan order is used to walk through all nodes. The scan order for child nodes that share the same parent node can be defined arbitrarily, such as (0,0,0)→(0,0,1)→(0,1,0)→(0,1,1)→(1,0,0)→(1,0,1)→(1,1,0)→(1,1,1).

In embodiments, starting from a top node, a breadth-first-search scan order is used to walk through all nodes. Because each pyramid depth is a 3D shape, the scan order in each depth can be defined arbitrarily. In embodiments, the scan order is defined using a below pseudo code to align with a pyramid coding method:

```
for (int d = start_depth; d < total_depth; ++d)
    for (int by = 0; by < height[d]; by += 2)
        for (int bx = 0; bx < width[d]; bx += 2)
            for (int bz = 0; bz < length[d]; bz += 2)
                for (int y = by; y < by + min(2, height[d] - by); ++y)
                    for (int x = bx; x < bx + min(2, width[d] - bx); ++x)
                        for (int z = bz; z < bz + min(2, length[d] - bz); ++z)
                            process node[d][z][y][x]
```

An encoding_start_depth syntax element indicates a first depth that participate in an encoding process. When walking through all nodes using a predefined scan order, encoding of a current node value is skipped if a depth of this node is above encoding_start_depth. Multiple CU3Ds, CTU3Ds, layers or models can share one encoding_start_depth.

In embodiments, encoding_start_depth is signalled to a bitstream explicitly.

In embodiments, encoding_start_depth is predefined and inferred inexplicitly.

In embodiments, encoding_start_depth is set to a last depth of a 3D-Pyramid structure and inferred inexplicitly.

3D-Pyramid Coding Method

There are different methods of walking through all nodes and encoding coefficients represented by different 3D-trees.

For a 3D-Octree, in embodiments, if a value of a parent node is 0, scanning and encoding of its child nodes (and their child nodes) is skipped as their values may always be 0. If the value of the parent node is 1 and the values of all but last child nodes are all 0s, the last child node is still scanned, but encoding of its value is skipped as it may always be 1. If a current depth is a last depth of a pyramid and if a current node value is 1, a sign of a map value is encoded when a codebook method is not used, followed by the map value itself.

For a 3D-Unitree, in embodiments, a value of a given node is encoded. If the node value is zero, its corresponding unified value is encoded and encoding of its child nodes (and their child nodes) is skipped as their absolute values may always equal to a unified value. Its child nodes are continued to be scanned until a bottom depth is reached, where a sign bit of each child node is encoded if a node value is non-zero.

For a 3D-Unitree, in embodiments, a value of a given node is encoded. If the node value is zero, its corresponding unified value is encoded and scanning and encoding of its child nodes (and their child nodes) are skipped as their absolute value may always equal to a unified value. And after all nodes in this CU3D are processed, a pyramid is scanned again and a sign bit of each child node at a bottom depth is encoded if a node value is non-zero.

For a 3D-Tagtree, in embodiments, a value is encoded if a node is a top node that does not have a parent node. For any child node, a difference between the parent node and this child node is encoded. If a value of a parent node is X and values of all but last child nodes are bigger than X, the last child nodes are still scanned, but encoding of their values may be skipped as they may always be X.

For a 3D-Unitagtree, in embodiments, a value of a given node from Unitree is first encoded. A Tagtree coding method is used to encode either a Tagtree value if the node is a top node that does not have a parent node or a difference of a Tagtree value between the parent node and this child node. Node skipping methods introduced in the Tagtree coding section are adopted as well. If a Unitree node value is zero, scanning and encoding of its child nodes (and their child nodes) are skipped as their values may always equal to a unified value.

There is a case in which start_depth is a last depth. In embodiments, these coefficients skipping methods described previously are disabled so all coefficients are encoded. In embodiments, to take advantage of these coefficients skipping methods described previously, a 3D-Pyramid tree is encoded by adjusting start_depth so that start_depth is a second last depth. In embodiments, for a 3D-Uniagtree, a unitree part of a 3D-Pyramid tree is encoded by adjusting start_depth so that start_depth is a second last depth, and a tagtree part of 3D-Pyramid tree is encoded without adjusting start_depth.

A layer uniform flag (e.g., layer_uniform_flag) is defined for a convolution and fully-connect layer to indicate if this layer is encoded using a 3D-Pyramid coding method, which may be called a uniform coding method.

If layer_uniform_flag flag equals to zero, this layer is encoded using the methods described in current working drafts, which may be called non-uniform coding methods.

If layer_uniform_flag equals to one, this layer is reshaped to a CTU3D layout. For each CTU3D, a CTU3D uniform flag (e.g., ctu3d_uniform_flag) is defined to indicate whether all child nodes at a bottom depth that share the same parent node are unified (nodes that do not share the same parent node may have different unification values).

If the CTU3D uniform flag (e.g., ctu3d_uniform_flag) equals to one, for this CTU3D, all child nodes at a bottom depth that share the same parent node are unified (nodes that do not share the same parent node may have different unification values). In embodiments, a 3D-Unitree coding method (which may be called a uniform coding method) is used to encode this CTU3D. encoding_start_depth is set to a last depth of a 3D-Pyramid structure and inferred inexplicitly. Encoding of a unification value of the node can be skipped as it may always be 0. In embodiments, one unification value can be encoded for all child nodes at a bottom depth that share the same parent node, followed by sign bits of these child nodes if a node value is a non-zero value. In embodiments, one unification value can be encoded for all child nodes at a bottom depth that share the same parent node. And after all nodes in this CU3D are processed, a pyramid is scanned again, and a sign bit of each child nodes at a bottom depth is encoded if a node value is non-zero.

If ctu3d_uniform_flag flag equals to zero, in embodiments, a 3D-Tagtree coding method (which may be called a non-uniform coding method) is used to encode this CTU3D. encoding_start_depth is set to a last depth of a 3D-Pyramid structure and inferred inexplicitly. In embodiments, a value of a child node is encoded based on a predefined scan order. In embodiments, an absolute value of the child node is encoded, followed by its sign bit, based on the predefined scan order. In embodiments, absolute values for all child nodes are encoded based on the predefined scan order. After all nodes in this CU3D are processed, sign bits of all child nodes are encoded if a node value is non-zero.

Dependent Quantization

The dependent quantization process may require that parameters are reconstructed in a scanning order (in the same order in which they are entropy decoded), due to dependencies between reconstructed values. Then a method of dependent scalar quantization is realized by: a) defining two scalar quantizers with different reconstruction levels; and b) defining a process for switching between the two scalar quantizers.

Similar to conventional uniform reconstruction quantizers, for both the quantizers (denoted by Q0 and Q1 in FIG. 4), a location of available reconstruction levels is uniquely specified by a quantization step size Δ. The two scalar quantizers Q0 and Q1 are characterized as follows.

Q0: The reconstruction levels of the first quantizer Q0 are given by even integer multiples of the quantization step size Δ. When this quantizer is used, a reconstructed neural network parameter t' is calculated according to t'=2·k·Δ, where k denotes an associated parameter level (transmitted quantization index).

Q1: The reconstruction levels of the second quantizer Q1 are given by odd integer multiples of the quantization step size Δ and in addition, the reconstruction levels equal to zero. A mapping of neural network parameter levels k to reconstructed parameters t' is specified by t'=(2·k−sgn(k))·Δ, where sgn(·) denotes a signum function:

$$sgn(x) = \begin{cases} 1 & : x > 0 \\ 0 & : x = 0 \\ -1 & : x < 0 \end{cases} \quad (4)$$

Instead of signalling a used quantizer (Q0 or Q1) for a current weight parameter explicitly in a bitstream, it is determined by parities of weight parameter levels that precede a current weight parameter in a coding/reconstruction order. A switching between quantizers is realized via a state machine, which is represented by Table 3. A state has eight possible values (0, 1, 2, 3, 4, 5, 6, 7) and is uniquely determined by the parities of the weight parameter levels preceding the current weight parameter in the coding/reconstruction order. For each layer, a state variable is initially set to 0. Whenever a weight parameter is reconstructed, the state is updated afterwards according to Table 3, where k denotes a value of a transform coefficient level. A next state only depends on the current state and a parity (k & 1) of the current weight parameter level k. Hence, a state update can be obtained by: state=sttab[state][k & 1], where sttab represents Table 3.

TABLE 3

State transition table for determining a scalar quantizer used for neural network parameters, where k denotes a value of a neural network parameter.

| current state | next state for (k & 1) == 0 | next state for (k & 1) == 1 | Quantizer (Q0/Q1) for current parameter |
|---|---|---|---|
| 0 | 0 | 2 | 0 |
| 1 | 7 | 5 | 1 |
| 2 | 1 | 3 | 0 |
| 3 | 6 | 4 | 1 |
| 4 | 2 | 0 | 0 |
| 5 | 5 | 7 | 1 |
| 6 | 3 | 1 | 0 |
| 7 | 4 | 6 | 1 |

A state uniquely specifies a scalar quantizer used. If a state value for a current weight parameter is even (0, 2, 4, 6), a scalar quantizer Q0 is used. Otherwise, if the state value is odd (1, 3, 5, 7), a scalar quantizer Q1 is used.

Because a dependent quantization process may require that parameters are reconstructed in a scanning order (in the same order in which they are entropy decoded), all coefficients in a baseline coding method are scanned and entropy coded. However, due to the nature of a 3D-Pyramid coding method, coefficients can be skipped from an entropy coding process.

In embodiments, a dependent quantization process is disabled when a 3D-Pyramid coding method is used.

In embodiments, a dependent quantization process is enabled when a 3D-Pyramid coding method is used. A dependent quantization construction process is changed so that these coefficients, if they are skipped from an entropy coding process, can be excluded from construction of dependent quantization coefficients. An absolute value of coefficients is used to construct dependent quantization.

Context Update for Entropy Coding

A baseline coding method reshapes a 4D weight tensor to a 2D weight tensor. A previously-encoded weight coefficient is saved as a neighbour weight and used to update a context of a current coefficient. The saved coefficient is reset to zero when a number of encoded coefficients can be divided by an input channel times a kernel size.

A unification based coding method reshapes a 4D weight tensor to a 3D weight tensor.

In embodiments, when updating a neighbour weight, a previously encoded weight coefficient is saved as a neighbour weight and used to update a context of a current coefficient. A saved coefficient is reset to zero when a number of encoded coefficients can be divided by an input channel times a kernel size.

In embodiments, when updating a neighbour weight, a previously encoded weight coefficient is saved as a neighbour weight and used to update a context of a current coefficient. A saved coefficient is reset to zero when a number of encoded coefficients can be divided by a kernel size.

Syntax Table

An example of a corresponding syntax table is listed below. Elements with bold font are syntax elements.

Ndim(arrayName[ ]) returns a number of dimensions of arrayName[ ].

scan_order specifies a block scanning order for parameters with more than one dimension according to the following table:
    0: No block scanning
    1: 8×8 blocks
    2: 16×16 blocks
    3: 32×32 blocks
    4: 64×64 blocks

TABLE 4

| | Descriptor |
|---|---|
| quant_tensor( dimensions, maxNumNoRem) { | |
|   layer_uniform = 0 | |
|   layerWidth = Prod( dimensions ) / dimensions[0] | |
|   kernel_size = (Ndim(dimensions) == 1) ? 1 : layerWidth / dimensions[1] | |
|   if((kernel_size != 1 \|\| layerWidth != 1) && (dq_flag == 0) && (scan_order != 0)) | |
|     layer_uniform_flag | ae(v) |

TABLE 4-continued

| | Descriptor |
|---|---|
| if( layer_uniform )<br>   quant_tensor_uniform( dimensions, maxNumNoRem)<br>else<br>   quant_tensor_baseline( dimensions, maxNumNoRem)<br>} | | layer_uniform_flag specifies whether the quantized weight QuantParam[ ] is encoded using uniform method. A layer_uniform flag equal to 1 indicates that QuantParam[ ] is encoded using uniform method.

TABLE 5

| | Descriptor |
|---|---|
| quant_tensor_baseline( dimensions, maxNumNoRem) {<br>  stateId = 0<br>  for( i = 0; i < Prod( dimensions ); i++ ) {<br>    idx = TensorIndex( dimensions, i, scan_order )<br>    int_param( idx, maxNumNoRem, stateId, 1)<br>    if(dq_flag) {<br>      nextSt= StateTransTab[stateId][QuantParam[idx] & 1]<br>      if( QuantParam[idx] != 0 ) {<br>        QuantParam[idx] = QuantParam[idx] << 1<br>        QuantParam[idx] += QuantParam[idx] < 0 ?<br>          ( stateId & 1 ) : − ( stateId & 1 )<br>      }<br>      stateId = nextSt<br>    }<br>  }<br>} | |

The 2D integer array StateTransTab[ ][ ] specifies the state transition table for dependent scalar quantization and is as follows:

StateTransTab[ ][ ]={{0,2},{7,5},{1,3},{6,4},{2,0},{5,7},{3,1},{4,6}}

TABLE 6

| | Descriptor |
|---|---|
| quant_tensor_uniform( dimensions, maxNumNoRem) {<br>  layerWidth = Prod( dimensions ) / dimensions[0]<br>  kernel_size = (Ndim(dimensions) == 1) ? 1 : layerWidth / dimensions[1]<br>  layer_width = layerWidth / kernel_size<br>  layer_height = dimensions[0]<br>  block_height = block_width = (4 << scan_order)<br>  for ( ly = 0; ly < layer_height; ly += block_height) {<br>    for ( lx = 0; lx < layer_width; lx += block_width) {<br>      stateId = 0<br>      scanIterator = 0<br>      level_uniform[ ]<br>      ctu3d_width =min(block_width, layer_width − lx);<br>      ctu3d_height =min(block_height, layer_height − ly);<br>      ctu3d_uniform_flag | ae(v) |
|       for ( by = 0; by < ctu3d_height; by += 2) {<br>        for ( bx = 0; bx < ctu3d_width; bx += 2) {<br>          for ( bz = 0; bz < kernel_size; bz += 2) {<br>            lt =min(2, kernel_size − bz);<br>            ht = min(2, ctu3d_height − by);<br>            wt =min(2, ctu3d_width − bx);<br>            for ( y = 0; y < ht; ++y) {<br>              for ( x = 0; x < wt; ++x) {<br>                for ( z = 0; z < lt; ++z) {<br>                  if(ctu3d_uniform_flag && (x != 0 \|\| y != 0 \|\| z != 0))<br>                    continue<br>                  int_param( 0, maxNumNoRem, stateId, 0 )<br>                  if(dq_flag) {<br>                    nextSt= StateTransTab[stateId][QuantParam[idx] & 1]<br>                    if( QuantParam[0] != 0 ) {<br>                      QuantParam[0] = QuantParam[0] << 1<br>                      QuantParam[0] += QuantParam[0] < 0 ?<br>                        ( stateId & 1 ) : − ( stateId & 1 )<br>                  }<br>                  stateId = nextSt<br>                }<br>                level_uniform[scanIterator++] = QuantParam[0]<br>              }<br>            }<br>            }<br>          }<br>        }<br>      }<br>      scanIterator = 0<br>      for ( by = 0; by < ctu3d_height; by += 2) {<br>        for ( bx = 0; bx < ctu3d_width; bx += 2) {<br>          for ( bz = 0; bz < kernel_size; bz += 2) { | |

TABLE 6-continued

| | Descriptor |
|---|---|
| ```
            lt =min(2, kernel_size - bz);
            ht =min(2, ctu3d_height - by);
            wt =min(2, ctu3d_width - bx);
            for ( y = 0; y < ht; ++y ) {
              for ( x = 0; x < wt; ++x ) {
                for ( z = 0; z < lt; ++z ) {
                  idx = (ly + by + y) * layerWidth +
                        (lx + bx + x) * kernel_size + bz + z;
                  sign = 0
                  if(level_uniform[scanIterator])
                    sign
                  sign = (sign) ? -1 : 1;
                  QuantParam[idx] = sign * level_uniform[scanIterator];
                  if(ctu3d_uniform_flag == 0)
                    scanIterator++;
                }
              }
            }
            if(ctu3d_uniform_flag)
              scanIterator++;
          }
        }
      }
    }
  }
}
``` | |
| | ae(v) | ctu3d_uniform_flag specifies whether the quantized CTU3D weight QuantParam[ ] is encoded using uniform method. A ctu3d_uniform_flag equal to 1 indicates that QuantParam[ ] is encoded using uniform method.
sign_flag specifies whether the quantized weight QuantParam[i] is positive or negative. A sign_flag equal to 1 indicates that QuantParam[i] is negative.

TABLE 7

| | Descriptor |
|---|---|
| ```
int_param( i, maxNumNoRem, stateId, sign ) {
  QuantParam[i] = 0
  sig_flag
  if( sig_flag ) {
    QuantParam[i]++
    sign_flag=0
    if( sign )
      sign_flag
    j = -1
    do {
      j++
      abs_level_greater_x[j]
      QuantParam[i] += abs_level_greater_x[j]
    } while( abs_level_greater_x[j] == 1 && j < maxNumNoRem )
    if( j == maxNumNoRem ) {
      RemBits = 0
      j = -1
      do {
        j++
        abs_level_greater_x2[j]
        if( abs_level_greater_x2[j] ) {
          RemBits++
          QuantParam[i] += 1 << RemBits
        }
      } while( abs_level_greater_x2[j] && j < 30 )
      abs_remainder
      QuantParam[i] += abs_remainder
    }
    QuantParam[i] = sign_flag ? -QuantParam[i] :
          QuantParam[i]
  }
}
``` | ae(v)<br><br>ae(v)<br><br><br>ae(v)<br><br><br><br><br>ae(v)<br><br><br><br>uae(RemBits) | sig_flag specifies whether the quantized weight QuantParam[i] is nonzero. A sig_flag equal to 0 indicates that QuantParam[i] is zero.
sign_flag specifies whether the quantized weight QuantParam[i] is positive or negative. A sign_flag equal to 1 indicates that QuantParam[i] is negative.
abs_level_greater_x[j] indicates whether the absolute level of QuantParam[i] is greater j + 1.
abs_level_greater_x2[j] includes the unary part of the exponential golomb remainder.
abs_remainder indicates a fixed length remainder.

Figure 6A:
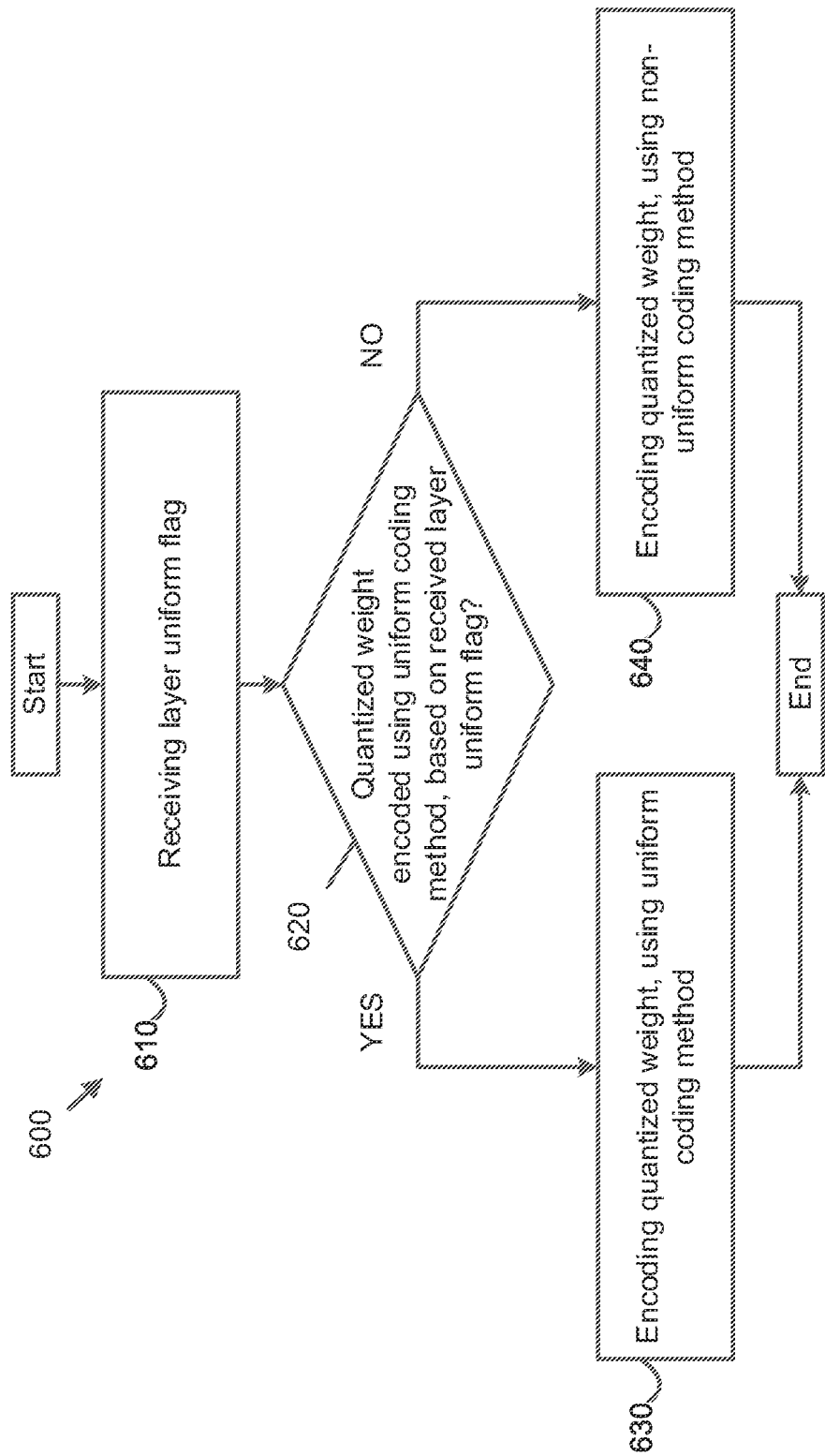
FIG. 6A is a flowchart of a method of unification based coding for neural network model compression, according to embodiments.

FIG. 6A is a flowchart of a method 600 of unification based coding for neural network model compression, according to embodiments.

In some implementations, one or more process blocks of FIG. 6 may be performed by the platform 120. In some implementations, one or more process blocks of FIG. 6 may be performed by another device or a group of devices separate from or including the platform 120, such as the user device 110.

As shown in FIG. 6A, in operation 610, the method 600 includes receiving a layer uniform flag indicating whether a quantized weight of an input neural network is encoded using a uniform coding method.

In operation 620, the method 600 includes determining whether the quantized weight is encoded using the uniform coding method, based on the received layer uniform flag.

Based on the quantized weight being determined to be encoded using the uniform coding method (operation 620—YES), in operation 630, the method 600 includes encoding the quantized weight, using the uniform coding method.

Based on the quantized weight being determined to not be encoded using the uniform coding method (operation 620-NO), in operation 640, the method 600 includes encoding the quantized weight, using a non-uniform coding method.

Figure 6B:
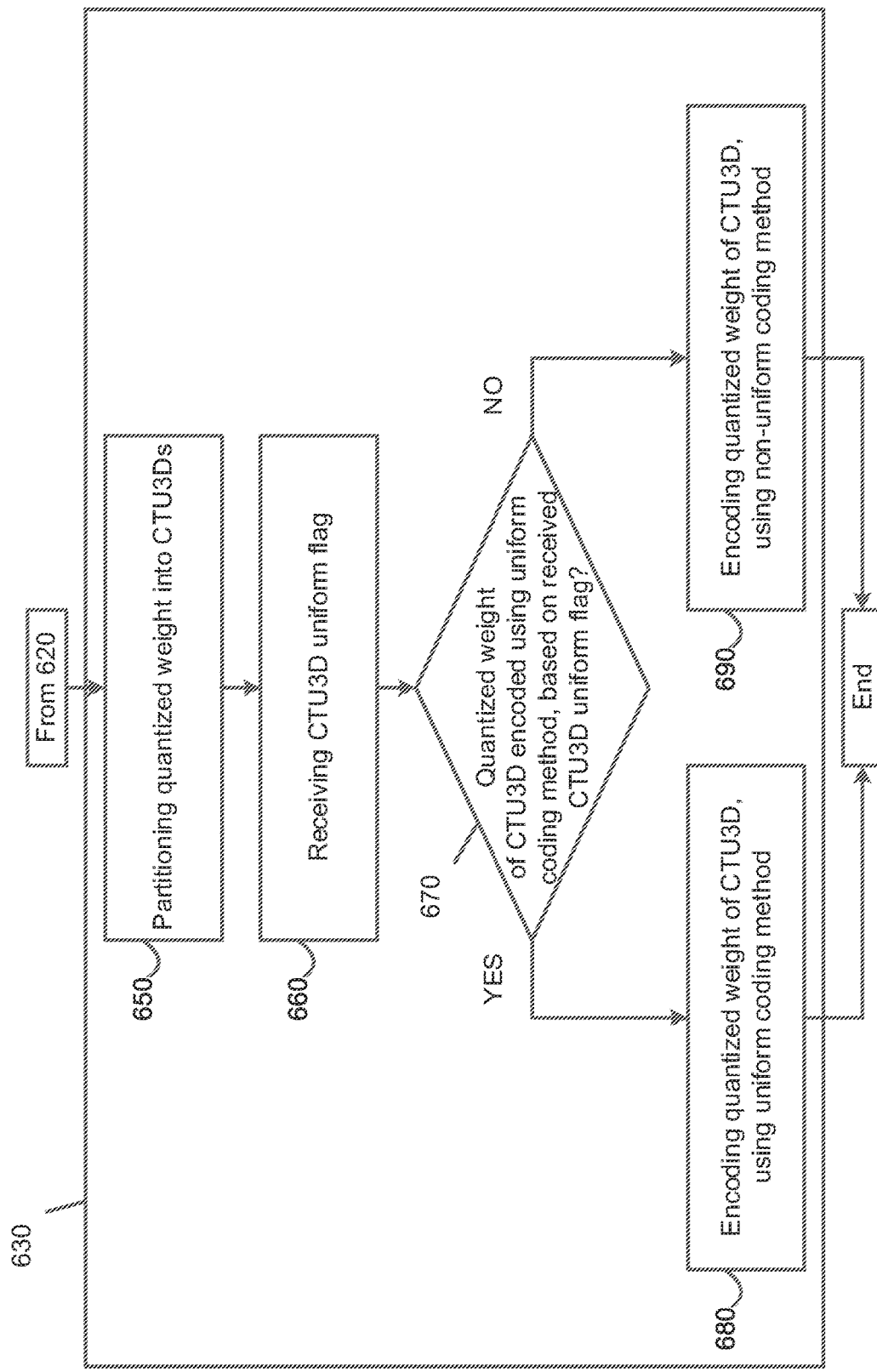
FIG. 6B is a flowchart of an operation of encoding a quantized weight, using a uniform coding method, as illustrated in FIG. 6A.

FIG. 6B is a flowchart of the operation 630 of encoding the quantized weight, using the uniform coding method, as illustrated in FIG. 6A.

As shown in FIG. 6B, in operation 650, the operation 630 includes partitioning the quantized weight of the input neural network into a plurality of three-dimensional coding tree units (CTU3Ds).

In operation 660, the operation 630 includes receiving a CTU3D uniform flag indicating whether a quantized weight of one of the plurality of CTU3Ds is encoded using the uniform coding method.

In operation 670, the operation 630 includes determining whether the quantized weight of the one of the plurality of CTU3Ds is encoded using the uniform coding method, based on the received CTU3D uniform flag.

Based on the quantized weight of the one of the plurality of CTU3Ds being determined to be encoded using the uniform coding method (operation 670—YES), in operation 680, the operation 630 includes encoding the quantized weight of the one of the plurality of CTU3Ds, using the uniform coding method.

Based on the quantized weight of the one of the plurality of CTU3Ds being determined to not be encoded using the uniform coding method (operation 670—NO), in operation 690, the operation 630 includes encoding the quantized weight of the one of the plurality of CTU3Ds, using the non-uniform coding method.

The encoding the quantized weight of the one of the plurality of CTU3Ds, using the uniform coding method, may include encoding the quantized weight of the one of the plurality of CTU3Ds, using a 3D-Unitree coding method.

The method 600 may further include, based on the quantized weight of the one of the plurality of CTU3Ds being encoded, using the 3D-Unitree coding method, encoding a sign flag indicating whether the quantized weight of the one of the plurality of CTU3Ds is positive or negative.

The method 600 may further include, based on a quantized weight of each of the plurality of CTU3Ds being encoded, using the 3D-Unitree coding method, encoding a sign flag indicating whether the quantized weight of each of the plurality of CTU3Ds is positive or negative.

The encoding the quantized weight of the one of the plurality of CTU3Ds, using the non-uniform coding method, may include encoding the quantized weight of the one of the plurality of CTU3Ds, using a 3D-Tagtree coding method.

The method 600 may further include, based on the quantized weight of the one of the plurality of CTU3Ds being encoded, using the 3D-Tagtree coding method, encoding a sign flag indicating whether the quantized weight of the one of the plurality of CTU3Ds is positive or negative.

The method 600 may further include, based on a quantized weight of each of the plurality of CTU3Ds being encoded, using the 3D-Tagtree coding method, encoding a sign flag indicating whether the quantized weight of each of the plurality of CTU3Ds is positive or negative.

Although FIG. 6 shows example blocks of the method 600, in some implementations, the method 600 may include additional blocks, fewer blocks, different blocks, or differently arranged blocks than those depicted in FIG. 6. Additionally, or alternatively, two or more of the blocks of the method 600 may be performed in parallel.

Figure 7:
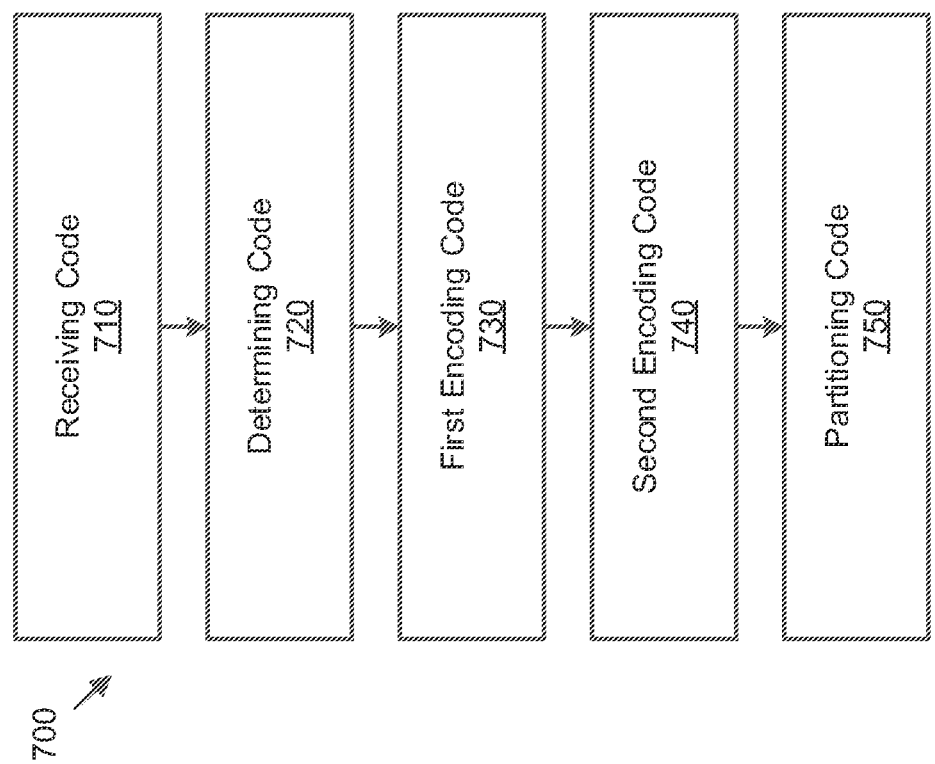
FIG. 7 is a block diagram of an apparatus for unification based coding for neural network model compression, according to embodiments.

FIG. 7 is a diagram of an apparatus 700 for unification based coding for neural network model compression, according to embodiments.

As shown in FIG. 7, the apparatus 700 includes receiving code 710, determining code 720, first encoding code 730, second encoding code 740 and partitioning code 750.

The receiving code 710 is configured to cause an at least one processor to receive a layer uniform flag indicating whether a quantized weight of an input neural network is encoded using a uniform coding method.

The determining code 720 is configured to cause the at least one processor to determine whether the quantized weight is encoded using the uniform coding method, based on the received layer uniform flag.

The first encoding code 730 is configured to cause the at least one processor to, based on the quantized weight being determined to be encoded using the uniform coding method, encode the quantized weight, using the uniform coding method.

The second encoding code 740 is configured to cause the at least one processor to, based on the quantized weight being determined to not be encoded using the uniform coding method, encode the quantized weight, using a non-uniform coding method.

The partitioning code 750 is configured to cause the at least one processor to partition the quantized weight of the input neural network into a plurality of three-dimensional coding tree units (CTU3Ds), The receiving code 710 is further configured to cause the at least one processor to receive a CTU3D uniform flag indicating whether a quantized weight of one of the plurality of CTU3Ds is encoded using the uniform coding method.

The determining code 720 is further configured to cause the at least one processor to determine whether the quantized weight of the one of the plurality of CTU3Ds is encoded using the uniform coding method, based on the received CTU3D uniform flag.

The first encoding code 730 is further configured to cause the at least one processor to, based on the quantized weight of the one of the plurality of CTU3Ds being determined to be encoded using the uniform coding method, encode the quantized weight of the one of the plurality of CTU3Ds, using the uniform coding method.

The second encoding code 740 is further configured to cause the at least one processor to, based on the quantized weight of the one of the plurality of CTU3Ds being determined to not be encoded using the uniform coding method, encode the quantized weight of the one of the plurality of CTU3Ds, using the non-uniform coding method.

The first encoding code 730 may be further configured to cause the at least one processor to encode the quantized weight of the one of the plurality of CTU3Ds, using a 3D-Unitree coding method.

The first encoding code 730 may be further configured to cause the at least one processor to, based on the quantized weight of the one of the plurality of CTU3Ds being encoded, using the 3D-Unitree coding method, encode a sign flag indicating whether the quantized weight of the one of the plurality of CTU3Ds is positive or negative.

The first encoding code 730 may be further configured to cause the at least one processor to, based on a quantized weight of each of the plurality of CTU3Ds being encoded, using the 3D-Unitree coding method, encode a sign flag indicating whether the quantized weight of each of the plurality of CTU3Ds is positive or negative.

The second encoding code 740 may be further configured to cause the at least one processor to encode the quantized weight of the one of the plurality of CTU3Ds, using a 3D-Tagtree coding method.

The second encoding code 740 may be further configured to cause the at least one processor to, based on the quantized weight of the one of the plurality of CTU3Ds being encoded, using the 3D-Tagtree coding method, encode a sign flag indicating whether the quantized weight of the one of the plurality of CTU3Ds is positive or negative.

The second encoding code 740 may be further configured to cause the at least one processor to, based on a quantized weight of each of the plurality of CTU3Ds being encoded, using the 3D-Tagtree coding method, encode a sign flag indicating whether the quantized weight of each of the plurality of CTU3Ds is positive or negative.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

Even though combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein may be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method of unification based coding for neural network model compression, the method being performed by at least one processor, and the method comprising:
   receiving a layer uniform flag indicating whether a quantized weight of an input neural network is encoded using a uniform coding method;
   determining whether the quantized weight is encoded using the uniform coding method, based on the received layer uniform flag;
   based on the quantized weight being determined to be encoded using the uniform coding method, encoding the quantized weight using the uniform coding method; and
   based on the quantized weight being determined to not be encoded using the uniform coding method, encoding the quantized weight using a non-uniform coding method.

2. The method of claim 1, wherein the encoding the quantized weight, using the uniform coding method, comprises:
   partitioning the quantized weight of the input neural network into a plurality of three-dimensional coding tree units (CTU3Ds);
   receiving a CTU3D uniform flag indicating whether a quantized weight of one of the plurality of CTU3Ds is encoded using the uniform coding method;
   determining whether the quantized weight of the one of the plurality of CTU3Ds is encoded using the uniform coding method, based on the received CTU3D uniform flag;
   based on the quantized weight of the one of the plurality of CTU3Ds being determined to be encoded using the uniform coding method, encoding the quantized weight of the one of the plurality of CTU3Ds, using the uniform coding method; and
   based on the quantized weight of the one of the plurality of CTU3Ds being determined to not be encoded using the uniform coding method, encoding the quantized weight of the one of the plurality of CTU3Ds, using the non-uniform coding method.

3. The method of claim 2, wherein the encoding the quantized weight of the one of the plurality of CTU3Ds, using the uniform coding method, comprises encoding the quantized weight of the one of the plurality of CTU3Ds, using a 3D-Unitree coding method.

4. The method of claim 3, further comprising, based on the quantized weight of the one of the plurality of CTU3Ds being encoded, using the 3D-Unitree coding method, encoding a sign flag indicating whether the quantized weight of the one of the plurality of CTU3Ds is positive or negative.

5. The method of claim 3, further comprising, based on a quantized weight of each of the plurality of CTU3Ds being encoded, using the 3D-Unitree coding method, encoding a sign flag indicating whether the quantized weight of each of the plurality of CTU3Ds is positive or negative.

6. The method of claim 2, wherein the encoding the quantized weight of the one of the plurality of CTU3Ds, using the non-uniform coding method, comprises encoding the quantized weight of the one of the plurality of CTU3Ds, using a 3D-Tagtree coding method.

7. The method of claim 6, further comprising, based on the quantized weight of the one of the plurality of CTU3Ds being encoded, using the 3D-Tagtree coding method, encoding a sign flag indicating whether the quantized weight of the one of the plurality of CTU3Ds is positive or negative.

8. The method of claim 6, further comprising, based on a quantized weight of each of the plurality of CTU3Ds being encoded, using the 3D-Tagtree coding method, encoding a sign flag indicating whether the quantized weight of each of the plurality of CTU3Ds is positive or negative.

9. An apparatus for unification based coding for neural network model compression, the apparatus comprising:
at least one memory configured to store program code; and
at least one processor configured to read the program code and operate as instructed by the program code, the program code comprising:
receiving code configured to cause the at least one processor to receive a layer uniform flag indicating whether a quantized weight of an input neural network is encoded using a uniform coding method;
determining code configured to cause the at least one processor to determine whether the quantized weight is encoded using the uniform coding method, based on the received layer uniform flag;
first encoding code configured to cause the at least one processor to, based on the quantized weight being determined to be encoded using the uniform coding method, encode the quantized weight, using the uniform coding method; and
second encoding code configured to cause the at least one processor to, based on the quantized weight being determined to not be encoded using the uniform coding method, encode the quantized weight, using a non-uniform coding method.

10. The apparatus of claim 9, wherein the program code further comprises partitioning code configured to cause the at least one processor to partition the quantized weight of the input neural network into a plurality of three-dimensional coding tree units (CTU3Ds),
wherein the receiving code is further configured to cause the at least one processor to receive a CTU3D uniform flag indicating whether a quantized weight of one of the plurality of CTU3Ds is encoded using the uniform coding method,
the determining code is further configured to cause the at least one processor to determine whether the quantized weight of the one of the plurality of CTU3Ds is encoded using the uniform coding method, based on the received CTU3D uniform flag,
the first encoding code is further configured to cause the at least one processor to, based on the quantized weight of the one of the plurality of CTU3Ds being determined to be encoded using the uniform coding method, encode the quantized weight of the one of the plurality of CTU3Ds, using the uniform coding method, and
the second encoding code is further configured to cause the at least one processor to, based on the quantized weight of the one of the plurality of CTU3Ds being determined to not be encoded using the uniform coding method, encode the quantized weight of the one of the plurality of CTU3Ds, using the non-uniform coding method.

11. The apparatus of claim 10, wherein the first encoding code is further configured to cause the at least one processor to encode the quantized weight of the one of the plurality of CTU3Ds, using a 3D-Unitree coding method.

12. The apparatus of claim 11, wherein the first encoding code is further configured to cause the at least one processor to, based on the quantized weight of the one of the plurality of CTU3Ds being encoded, using the 3D-Unitree coding method, encode a sign flag indicating whether the quantized weight of the one of the plurality of CTU3Ds is positive or negative.

13. The apparatus of claim 11, wherein the first encoding code is further configured to cause the at least one processor to, based on a quantized weight of each of the plurality of CTU3Ds being encoded, using the 3D-Unitree coding method, encode a sign flag indicating whether the quantized weight of each of the plurality of CTU3Ds is positive or negative.

14. The apparatus of claim 10, the second encoding code is further configured to cause the at least one processor to encode the quantized weight of the one of the plurality of CTU3Ds, using a 3D-Tagtree coding method.

15. The apparatus of claim 14, wherein the second encoding code is further configured to cause the at least one processor to, based on the quantized weight of the one of the plurality of CTU3Ds being encoded, using the 3D-Tagtree coding method, encode a sign flag indicating whether the quantized weight of the one of the plurality of CTU3Ds is positive or negative.

16. The apparatus of claim 14, wherein the second encoding code is further configured to cause the at least one processor to, based on a quantized weight of each of the plurality of CTU3Ds being encoded, using the 3D-Tagtree coding method, encode a sign flag indicating whether the quantized weight of each of the plurality of CTU3Ds is positive or negative.

17. A non-transitory computer-readable storage medium storing instructions that, when executed by at least one processor for unification based coding for neural network model compression, cause the at least one processor to:
receive a layer uniform flag indicating whether a quantized weight of an input neural network is encoded using a uniform coding method;
determine whether the quantized weight is encoded using the uniform coding method, based on the received layer uniform flag;
based on the quantized weight being determined to be encoded using the uniform coding method, encode the quantized weight, using the uniform coding method; and
based on the quantized weight being determined to not be encoded using the uniform coding method, encode the quantized weight, using a non-uniform coding method.

18. The non-transitory computer-readable storage medium of claim 17, wherein the instructions, when executed by the at least one processor, further cause the at least one processor to:
partition the quantized weight of the input neural network into a plurality of three-dimensional coding tree units (CTU3Ds);
receive a CTU3D uniform flag indicating whether a quantized weight of one of the plurality of CTU3Ds is encoded using the uniform coding method;
determine whether the quantized weight of the one of the plurality of CTU3Ds is encoded using the uniform coding method, based on the received CTU3D uniform flag;
based on the quantized weight of the one of the plurality of CTU3Ds being determined to be encoded using the uniform coding method, encode the quantized weight of the one of the plurality of CTU3Ds, using the uniform coding method; and based on the quantized weight of the one of the plurality of CTU3Ds being determined to not be encoded using the uniform coding method, encode the quantized weight of the one of the plurality of CTU3Ds, using the non-uniform coding method.

19. The non-transitory computer-readable storage medium of claim 18, wherein the instructions, when executed by the at least one processor, further cause the at least one processor to encode the quantized weight of the one of the plurality of CTU3Ds, using a 3D-Unitree coding method.

20. The non-transitory computer-readable storage medium of claim 18, wherein the instructions, when executed by the at least one processor, further cause the at least one processor to encode the quantized weight of the one of the plurality of CTU3Ds, using a 3D-Tagtree coding method.

\* \* \* \* \*